US012706588B2

(12) United States Patent
Matsuura

(10) Patent No.: US 12,706,588 B2
(45) Date of Patent: Aug. 11, 2026

(54) CRYSTAL ELEMENT AND CRYSTAL DEVICE

(71) Applicant: KYOCERA Corporation, Kyoto (JP)

(72) Inventor: Daisuke Matsuura, Tendo (JP)

(73) Assignee: KYOCERA CORPORATION, Kyoto (JP)

( * ) Notice: Subject to any disclaimer, the term of this patent is extended or adjusted under 35 U.S.C. 154(b) by 99 days.

(21) Appl. No.: 18/710,008

(22) PCT Filed: Nov. 10, 2022

(86) PCT No.: PCT/JP2022/041864
§ 371 (c)(1),
(2) Date: May 14, 2024

(87) PCT Pub. No.: WO2023/085348
PCT Pub. Date: May 19, 2023

(65) Prior Publication Data

US 2025/0015778 A1 Jan. 9, 2025

(30) Foreign Application Priority Data

Nov. 15, 2021 (JP) ................................ 2021-185693

(51) Int. Cl.
*H03H 9/13* (2006.01)
*H03H 9/17* (2006.01)

(52) U.S. Cl.
CPC ............... *H03H 9/132* (2013.01); *H03H 9/17* (2013.01)

(58) Field of Classification Search
CPC .......... H03H 9/132; H03H 9/17; H03H 9/145; H03H 9/25; H03H 9/19
USPC ................................................ 333/186–188
See application file for complete search history.

(56) References Cited

U.S. PATENT DOCUMENTS

2013/0328452 A1* 12/2013 Fujihara ............... H10N 30/875 216/13
2016/0260886 A1* 9/2016 Kohda ..................... H03H 9/19
2018/0054181 A1* 2/2018 Kaga ........................ H03H 9/19

FOREIGN PATENT DOCUMENTS

JP 2013-255052 A 12/2013
JP 2020-025344 A 2/2020

* cited by examiner

*Primary Examiner* — Jorge L Salazar, Jr.
(74) *Attorney, Agent, or Firm* — Volpe Koenig

(57) ABSTRACT

Provided are a crystal element and a crystal device that have an improved DLD characteristic. The crystal element includes a crystal piece and a pair of electrodes. Each of the electrodes is positioned on a corresponding one of both surfaces of the crystal piece and includes a conductive layer having a gold content of 90% or more in mass ratio. The crystal element has the DLD characteristic in which a portion in a positive direction (+) and a portion in an opposite direction (−) are mixed.

16 Claims, 4 Drawing Sheets

| | EXCITATION ELECTRODE FILM THICKNESS T2 RANGE [nm] | PROTOTYPE FILM THICKNESS EXAMPLE [nm] | DLD CHARACTERISTIC | ΔF [ppm] | CI [Ω] | RESULT |
|---|---|---|---|---|---|---|
| COMPARATIVE EXAMPLE 1 | T2 < 224.9 | 102.0 | + | 9.0 | 22 | C |
| COMPARATIVE EXAMPLE 2 | | 220.6 | - | 9.9 | 51 | C |
| EXAMPLE 1 | 224.9 ≤ T2 < 233.5 | 224.9 | ± | 3.9 | 16 | B |
| EXAMPLE 2 | 233.5 ≤ T2 ≤ 239.1 | 233.5 | ± | 0.9 | 15 | A |
| EXAMPLE 3 | | 239.1 | ± | 0.8 | 14 | |
| COMPARATIVE EXAMPLE 3 | 239.1 < T2 ≤ 256.3 | 256.3 | ± | 2.2 | 29 | B |
| COMPARATIVE EXAMPLE 4 | 256.3 < T2 | 290.7 | ± | 2.5 | 62 | C |

CRYSTAL ELEMENT AND CRYSTAL DEVICE

TECHNICAL FIELD

The present disclosure relates to a crystal element and a crystal device.

BACKGROUND OF INVENTION

A known crystal element which obtains a signal by causing a crystal piece to resonate at a given frequency has a characteristic that a frequency increases as an excitation level (drive level) increases (DLD (drive level dependency) or excitation level dependency). Japanese Unexamined Patent Application Publication No. 2020-25344 discloses a technique in which a structure and a shape of an electrode have been devised to improve the DLD characteristic.

SUMMARY

Solution to Problem

One aspect of the present disclosure is as follows.

[A1] A crystal element includes a crystal piece and a pair of electrodes. Each of the electrodes is positioned on a corresponding one of both surfaces of the crystal piece and includes a conductive layer having a gold content of 90% or more in mass ratio. The crystal element has a DLD characteristic in which a portion in a positive direction (+) and a portion in an opposite direction (−) are mixed.

[A2] The crystal element according to A1 further includes a base layer between the conductive layer and the crystal piece.

[A3] In the crystal element according to [A1] or [A2], a resonance frequency of the crystal element is 40 MHz or more and 400 MHz or less.

[A4] In the crystal element according to any one of [A1] to [A3], a thickness of the conductive layer of the crystal element is 50 nm or more and 600 nm or less.

[A5] In the crystal element according to any one of [A1] to [A4], a crystal impedance of the crystal element is less than 30Ω.

[A6] In the crystal element according to any one of [A1] to [A5], a product value of a thickness (mm) of the conductive layer and a resonance frequency (MHz) of the crystal element is 0.017272 or more and 0.019684 or less.

[A7] In the crystal element according to any one of [A1] to [A6], the pair of electrodes is positioned at an identical position in plan view.

[A8] A crystal device includes the crystal element according to any one of [A1] to [A7].

Another aspect of the present disclosure is as follows.

[B1] A crystal element includes a crystal piece and an electrode. The electrode includes a base layer and a conductive layer. The base layer is positioned on both surfaces of the crystal piece at an identical position in plan view on the respective surfaces. The conductive layer is positioned on the base layer and has a gold content of 90% or more in mass ratio. A product value of a thickness (mm) of the conductive layer and a resonance frequency (MHz) of the crystal element is 0.017272 or more and 0.019684 or less.

[B2] In the crystal element according to [B1], the product value is 0.017933 or more and 0.018363 or less.

[B3] In the crystal element according to [B1] or [B2], the resonance frequency is 76.8 MHz.

[B4] A crystal device includes the crystal element according to any one of [B1] to [B3].

DESCRIPTION OF EMBODIMENT

Hereinafter, an embodiment is described with reference to the drawings.

Figure 1:
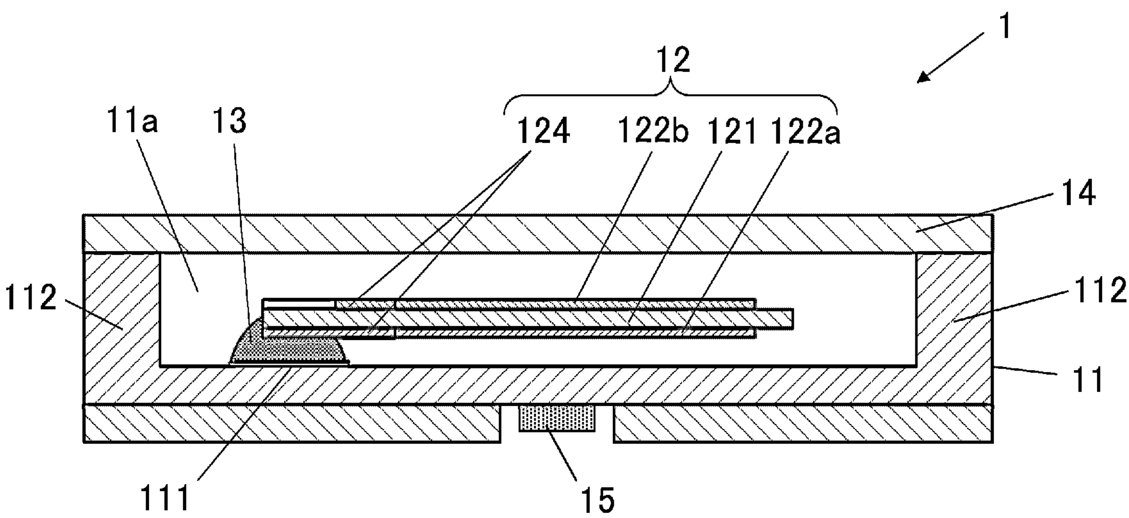
FIG. 1 is a view illustrating a certain sectional shape of a crystal device according to the embodiment.

FIG. 1 is a view illustrating a certain sectional shape of a crystal device 1 according to the embodiment.

The crystal device 1 includes a base body 11, a crystal vibration element 12 (crystal element), a conductive adhesive 13, a lid 14, and a component 15.

For example, the base body 11 is, but not particularly limited to, a ceramic material, a crystal, a semiconductor material, a glass material, or a combination thereof. The base body 11 includes a recessed part 11*a* at a middle portion of the base body 11 on an upper surface side. The recessed part 11*a* includes, on a bottom surface thereof, an electrode pad 111 protruding from the bottom surface. An upper surface of the electrode pad 111 has a flat shape and may be formed by screen printing, for example. Gold plating or the like may be applied to an uppermost surface of the electrode pad 111. The crystal vibration element 12 is adhered to the electrode pad 111 by the conductive adhesive 13. For example, the conductive adhesive 13 may be a resin-based (for example, a silicone-based resin or an epoxy resin) adhesive containing a silver filler. Particularly, the conductive adhesive 13 made of a silicone-based resin remains soft even after adhesion and is thus less likely to have an adverse effect on vibration.

The crystal vibration element 12 includes a crystal piece 121, a lower electrode 122*a* and an upper electrode 122*b* (collectively referred to as an excitation electrode 122; electrode), and a mount electrode 124. The excitation electrode 122 is in contact with both surfaces of the crystal piece 121 while sandwiching a vibration part of the crystal piece 121 from upper and lower sides. The mount electrode 124 is connected to an electrical circuit inside the base body 11 with the electrode pad 111 interposed therebetween to apply a voltage from outside of the crystal vibration element 12 to the excitation electrode 122 while the crystal vibration element 12 is mounted on the base body 11. The conductive adhesive 13 is adhered to the mount electrode 124. Therefore, the vibration part and the excitation electrode 122 are fixed in a floating state without being in contact with an inner wall surface of the recessed part 11*a*. Each of the excitation electrode 122 and the mount electrode 124 has a multilayer structure including a base layer and a conductive layer positioned on an upper surface side of the base layer.

The role of the base layer is to cause the crystal piece 121 to be in close contact with the conductive layer. Such a base layer is made of, for example, Cr, Ni, NiCr, Ti, or Mo. Among these, Cr is more suitable since Cr has a relatively low boiling point and enables formation of the base layer on the crystal piece 121 at a relatively low temperature. For example, the thickness of the base layer is preferably 1 nm or more and 20 nm or less and 10% or less of the thickness of the conductive layer. The base layer having a thickness of 1 nm or more is preferable since the base layer with such a thickness can suppress a reduction in the adhesion of the conductive layer as a result of the base layer component diffusing into the conductive layer when heat affects the crystal vibration element 12. The base layer having a thickness of 20 nm or less is preferable since the base layer with such a thickness can suppress a reduction, affected by the base layer, in the electrical characteristics of the conductive layer.

Although the conductive layer is not particularly limited as long as the conductive layer is made of a metal with high electrical conductivity, a density ρ ($g \cdot cm^{-3}$) of the conductive layer is preferably 15 or more and 25 or less, and especially preferably 18 or more and 20 or less. Here, the conductive layer is preferably made of gold (Au). The gold as used herein has a gold content of 90% or more (containing impurities of less than 10%), preferably 95% or more, and especially preferably 99% in mass ratio. Gold is preferable since gold is scientifically proven as being stable compared with other materials, is less likely to react with oxygen and/or sulfur in the atmosphere, and is thus less likely to cause a change in the frequency of the crystal vibration element. The conductive layer may include Ag, Al, or Cu. The conductive layer may include two or more layers.

The thickness of the conductive layer is typically 50 nm or more, preferably 75 nm or more, more preferably 100 nm or more, and especially preferably 200 nm or more. The thickness of the conductive layer is typically 600 nm or less, more preferably 450 nm or less, and especially preferably 300 nm or less.

For example, each of the excitation electrode 122 and the mount electrode 124 including such a base layer and a conductive layer may be formed by physical adsorption at a position determined using a spattering device or a vapor deposition device.

The crystal piece 121 has a substantially rectangular plate shape. The crystal piece 121 may be, for example, an AT-cut crystal, an SC-cut crystal, a BT-cut crystal, or the like and is preferably the AT-cut crystal. In a case in which an outer shape of the crystal piece 121 is formed by etching, anisotropic etching may result in a residue on a side surface of the crystal piece 121. The crystal piece 121 may have rounded corners.

The shape of the crystal piece 121 is preferably, but not particularly limited to, a rectangle. The length of a long side of the rectangular crystal piece 121 is typically 300 μm or more and 1500 μm or less, preferably 500 μm or more and 1200 μm or less, and especially preferably 700 μm or more and 1000 μm or less. The length of a short side of the rectangular crystal piece 121 is, but not particularly limited to, typically 100 μm or more and 1100 μm or less, preferably 250 μm or more and 900 μm or less, and especially preferably 400 μm or more and 700 μm or less, as long as the short side of the rectangular crystal piece 121 is shorter than the long side of the crystal piece 121. The ratio of the short side to the long side of the crystal piece 121 is typically 0.07 or more and less than 1, preferably 0.25 or more and 0.9 or less, and especially preferably 0.5 or more and 0.8 or less.

A thickness $T_1$ of the crystal piece 121 is defined in accordance with the resonance frequency of the crystal vibration element 12. Note that the thickness $T_1$ of the crystal piece 121 is not limited to being uniform. As long as the thickness of the vibration part is defined as described above, a part surrounding the vibration part may be thicker or thinner, or only a part corresponding to the mount electrode 124 (one end region of the crystal piece 121) may be thicker.

The resonance frequency of the crystal vibration element 12 is typically 40 MHz or more, preferably 45 MHz or more, more preferably 50 MHz or more, and further preferably 75.8 MHz or more. The resonance frequency of the crystal vibration element 12 is typically 400 MHz or less, preferably 300 MHz or less, more preferably 200 MHz or less, further preferably 150 MHz or less, further more preferably 77.8 MHz or less, and especially preferably 76.8 MHz.

An upper surface side of the recessed part 11*a* of the base body 11 (that is, an upper end of a frame body 112 surrounding the recessed part 11*a*) is joined to the lid 14 with a conductive sealing material such as gold-tin or silver braze interposed therebetween. Therefore, the recessed part 11*a* is sealed. A conductive frame-shaped metallized layer may be included between the base body 11 and the lid 14.

The electrode pad 111 is electrically connectable to an external device via a signal line (not illustrated) passing through the base body 11 (for example, connectable to external wiring or a substrate from an external connection pad provided to a bottom surface of the base body 11).

The component 15 is positioned on the bottom surface side of the base body 11. The component 15 may be an electronic component such as an IC chip or may be a sensor such as a temperature measurement element (a thermistor or the like). The component 15 may be a set of a plurality of components. These components may output additional information related to adjustment of an oscillation frequency of the crystal vibration element 12 or may perform adjustment in accordance with the additional information. That is, the crystal device 1 may be a temperature compensated crystal oscillator (TCXO) or the like. Note that the position of the component 15 is not necessarily in the vicinity of a middle part of the bottom surface in plan view and may be a position deviated to one side.

Vibration of the crystal vibration element 12 is described.

Figure 2A:
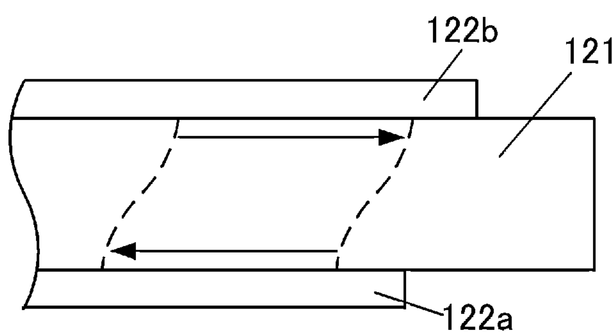
FIG. 2A is a diagram describing vibration of a crystal element.
Figure 2B:
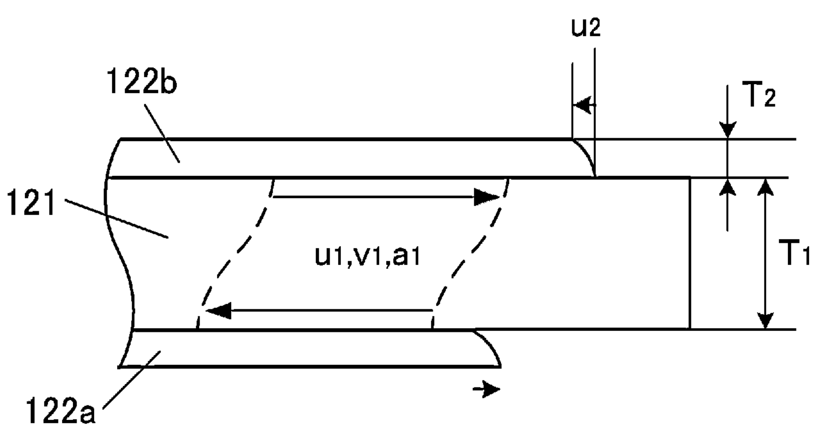
FIG. 2B is a diagram describing vibration of the crystal element.
Figure 2C:
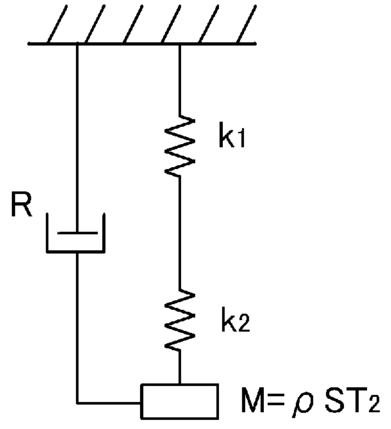
FIG. 2C is a diagram describing vibration of the crystal element.

FIGS. 2A to 2C are diagrams describing vibration of the crystal vibration element 12.

The crystal piece 121 of the crystal vibration element 12 causes thickness-shear vibration due to polarization in accordance with a voltage applied between the upper electrode 122*b* and the lower electrode 122*a*. The thickness-shear vibration is caused in a plane perpendicular to a polarization direction, that is, in an extending direction of the crystal piece 121. At this time, as illustrated in FIG. 2A, the excitation electrode 122 is approximately a rigid body and serves simply as a weight positioned on each of the upper surface and the lower surface of the crystal piece 121.

However, when the vibration frequency is high and the voltage, that is, the excitation level DL (drive level) is high, the electrode cannot approximate to the rigid body, and elastic vibration is caused in each electrode. That is, an electrode material (here, gold) having an elastic modulus different from that of the crystal piece 121 is arranged in series with the crystal piece 121.

As illustrated in FIG. 2B, driving at a high voltage in a high-frequency band may cause vibration in an axial direction the same as the direction of the thickness-shear vibration of the crystal piece 121 to be applied additionally to the excitation electrode 122. In this case, as schematically illustrated in FIG. 2C, vibration is caused in a manner in which the crystal piece 121, the lower electrode 122*a*, and the upper electrode 122*b* are connected in series. That is, a combined spring constant $k_t$ combines a spring constant $k_1$ of the crystal piece 121 and a spring constant $k_2$ of the excitation electrode 122. Therefore, the combined spring constant $k_t$ is denoted by the following Math Formula 1.

$$k_t = k_1 \cdot k_2 / (k_1 + k_2) \quad \text{(Math Formula 1)}$$

In the spring composed of the crystal piece 121 and the excitation electrode 122 connected in series, vibration in each of the crystal piece 121 and the excitation electrode 122 does not become fully linear vibration due to the influence of a difference in the elastic modulus. That is, as a nonlinear spring, for example, vibration of the crystal piece 121 is expressed as $k_1 = \Sigma(i_m \cdot u_1^m)$ while assuming that a coefficient of an mth order (m is from 0 to infinity) of the spring constant is $i_m$, and vibration of the excitation electrode 122 is expressed as $k_2 = \geq (j_n \cdot u_2^n)$ while assuming that a coefficient of an nth order (n is from 0 to infinity) of the spring constant is $j_n$. The coefficients $i_m$ and $j_n$ are values defined by the crystal piece 121 and the excitation electrode 122, respectively. Note that, even in the nonlinear spring, vibration of an extremely high order (for example, from 4th to 7th or higher orders) is generally ignorable.

The crystal vibration element 12 actually has the weight, and particularly the weight of gold which constitutes the excitation electrode 122, is not ignorable. Thus, here, mass M simply as a weight is connected to the spring component in series. The base layer of the excitation electrode 122 has, as described above, a sufficiently small thickness (less than 10%) in relation to the thickness of the conductive layer and also has a weight which is sufficiently small considering the density ratio. Accordingly the influence of the base layer on a characteristic of the excitation electrode 122 is ignorable. In the crystal vibration element 12, a contact area S between the crystal piece 121 and the excitation electrode 122 is substantially defined by a resonance frequency F. Therefore, when a certain material (that is, a material having a single density p) is used, the mass M depends mainly on a thickness $T_2$ of the excitation electrode 122. Here, the thickness $T_2$ of the excitation electrode 122 is an average of the thickness of the conductive layer of the lower electrode 122*a* and the thickness of the conductive layer of the upper electrode 122*b*.

Here, a force to excite the vibration of the crystal vibration element 12 (excitation level) is defined by an average value <P> of a power P applied to the crystal vibration element 12. With a series resistance R of the crystal vibration element 12, an amplitude u of the crystal piece 121 is expressed as $u_1 = \alpha(\langle P \rangle / R)^{1/2}$ (α is a constant of proportionality). That is, the amplitude $u_1$ depends on the excitation level. Moreover, a displacement velocity $v_1$ and a displacement acceleration $a_1$, which are differential values of the amplitude $u_1$, depend on, in addition to the excitation level, the resonance frequency F at the amplitude $u_1$.

At a contact surface between the excitation electrode 122 and the crystal piece 121, displacement of the excitation electrode 122 is naturally the same as displacement of the crystal piece 121. At a portion of the excitation electrode 122 apart from the crystal piece 121, displacement is considered to occur in the shear direction (the axial direction the same as the displacement direction of the crystal piece 121) in a manner such that the displacement of the crystal piece 121 is delayed in accordance with the rigidity and inertia (mass=gold density×contact area with the crystal piece 121×thickness $T_2$ perpendicular to the contact surface with the crystal piece 121, and displacement acceleration $a_1$ of the crystal piece 121) of the excitation electrode 122. Therefore, in relation to the displacement of the crystal piece 121, the displacement of the excitation electrode 122 at the portion on the opposite side from the part in contact with the crystal piece 121 (relative amplitude $u_2$ with respect to the surface in contact with the vibrating crystal piece 121) is expressed by the following Math Formula 2 in accordance with the thickness $T_2$ of the excitation electrode 122 and the displacement acceleration $a_1$ of the surface of the crystal piece 121.

$$u_2 = T_2 \cdot a_1 / V_2 \quad \text{(Math Formula 2)}$$

$V_2$ is a constant depending on the rigidity and mass, that is, the constant based on the material of the excitation electrode 122, and is an acoustic velocity of the thickness-shear in the material. Thus, the amplitude $u_2$ depends on the excitation level and the resonance frequency F.

Here, as is well known, the resonance frequency F of the crystal vibration element 12 is expressed as v/λ with respect to the displacement velocity v and a wavelength λ, and the wavelength λ depends on a distance between the upper surface and the lower surface at open ends of vibration of the crystal piece 121, that is, depends on the thickness $T_1$ of the crystal piece 121. Accordingly, the resonance frequency F is expressed by the following Math Formula 3.

$$F = (k_t / M)^{1/2} / (2\pi T_1) \quad \text{(Math Formula 3)}$$

As described above, the thickness $T_1$ of the crystal piece 121 is a value defined in accordance with the resonance frequency, and the mass M of the excitation electrode 122 depends on the thickness $T_2$ of the excitation electrode 122. As described above, the combined nonlinear spring constant $k_t$ includes a component which depends on the amplitude $u_1$ of the crystal piece 121 and a component which depends on the amplitude $u_2$ of the excitation electrode 122. From the above, the amplitude $u_1$ depends on the excitation level, and the amplitude $u_2$ depends on the thickness $T_2$, the excitation level and the resonance frequency F.

When the excitation electrode 122 is a rigid body, vibration depends only on the amplitude $u_1$ of the crystal piece 121. In this case, as is known in the related art, the resonance frequency F of the crystal vibration element 12 also simply and monotonically changes (increases) in accordance with a change (an increase) in the excitation level (hardening spring). On the other hand, in the case in which the excitation electrode 122 also vibrates as described above, the resonance frequency F includes the product of each item which depends on the amplitude $u_1$ of the crystal piece 121 and each item which depends on the amplitude $u_2$ of the excitation electrode 122, and the resonance frequency F thus depends on the product of the resonance frequency F and the thickness $T_2$ of the excitation electrode 122. In this case, whether the resonance frequency F increases in a monotonic manner as the excitation level increases is determined in accordance with, for example, a ratio of coefficients of high-order terms (mainly coefficients of 3rd or higher-order terms, etc.) of the spring constant $k_t$ (including the influence of the thickness $T_2$ and the resonance frequency F) related to the nonlinear vibration.

A ratio of the thickness $T_2$ of the excitation electrode 122 to the thickness $T_1$ of the crystal piece 121 is typically 0.0110 or more, and especially preferably 0.0114 or more. Moreover, the ratio of the thickness $T_2$ of the excitation electrode 122 to the thickness $T_1$ of the crystal piece 121 is typically 0.0138 or less, and especially preferably 0.0124 or less. The ratio falling within such a range can improve the DLD characteristic, thus being preferable.

For example, the excitation electrode 122 may have a circular shape, an elliptical shape, a polygonal shape, or a partial combination thereof in plan view. The excitation electrode 122 may have a polygonal shape with rounded corners. In a case in which the excitation electrode 122 has a polygonal shape (including a polygonal shape with rounded corners) in plan view, the polygonal shape is preferably a rectangular shape. In this case, the length of a long side of the excitation electrode 122 is typically 100 μm or more and 1100 μm or less, preferably 250 μm or more and 900 μm or less, and especially preferably 400 μm or more and 700 μm or less but is not particularly limited thereto as long as the length of a long side of the excitation electrode 122 is shorter than the long side of the crystal piece 121. The ratio of the long side of the excitation electrode 122 to the long side of the crystal piece 121 is typically 0.07 or more and less than 1, preferably 0.25 or more and 0.9 or less, and especially preferably 0.5 or more and 0.8 or less. The ratio of the short side to the long side of the excitation electrode 122 having the rectangular shape in plan view is typically 0.05 or more and less than 1, preferably 0.2 or more and 0.75 or less, and especially preferably 0.3 or more and 0.5 or less.

Shapes and sizes of the upper electrode 122*b* and the lower electrode 122*a* which are the components of the excitation electrode 122 may be the same as or different from each other. The excitation electrode 122 is preferably positioned on both surfaces of the crystal piece 121 at an identical position in plan view. Here, "an identical position in plan view" means that, in the case in which the excitation electrode 122 has the polygonal shape, each side of the upper electrode 122*b* and the corresponding side of the lower electrode 122*a* are positioned within a range of ±5 μm with respect to one another in plan view.

Figures 3, 4:
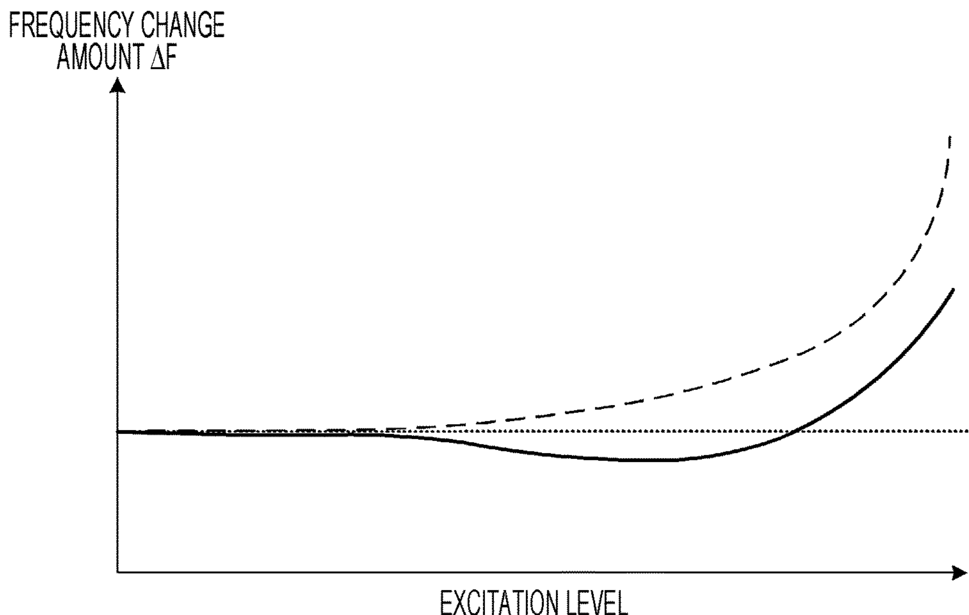
FIG. 3 is a table illustrating a DLD characteristic corresponding to a thickness of an excitation electrode when a target resonance frequency is defined.
FIG. 4 is a schematic diagram for describing the DLD characteristic.

FIG. 3 is a table illustrating a change tendency of the resonance frequency F corresponding to the thickness $T_2$ of the excitation electrode 122 in accordance with the excitation level in a case in which a target resonance frequency F (the thickness $T_1$ of the crystal piece 121) is defined.

This table displays measurement results in a case in which a set resonance frequency F is 76.8 MHz, the crystal piece 121 (AT-cut crystal, thickness: 21.5 μm) in a substantially rectangular shape has a long side of 805 μm and a short side of 537 μm, the excitation electrode 122 (gold content: 99% or more) disposed on both surfaces of the crystal piece 121 has a long side of 559 μm and a short side of 233 μm, a material of the base layer between the crystal piece and the excitation electrode is chromium (Cr), and a thickness of the base layer is 4 nm. Moreover, the table displays the measurement results when the excitation level is varied in a prototype including the excitation electrode 122 having the thickness $T_2$. Here, a dimensional tolerance of the excitation electrode 122 and a dimensional tolerance of the crystal piece 121 are each approximately ±10 μm.

The DLD characteristic (also referred to as excitation level dependency) indicates an increase or a decrease in a change in frequency in accordance with a change in the excitation level.

ΔF indicates a frequency change width in accordance with the change in the excitation level. More specifically, ΔF indicates a difference between the frequency corresponding to the excitation level and a frequency at an excitation level of 0.00 μW. Compared with a product according to the related art, a ΔF of 0 ppm or more at an excitation level (excitation power) of 250 μW is determined to be preferable since spurious oscillation is less likely to occur, and a ΔF of 6 ppm or less at an excitation level (excitation power) of 250 μW is determined to be a practically usable level without erroneous operation.

With respect to the DLD characteristic, "−" indicates a monotonic decrease tendency (opposite direction) in the resonance frequency change width (ΔF) in accordance with an increase in the excitation level when a graph (Y-axis (normal scale): ΔF; X-axis (logarithmic scale): excitation level) is prepared. More specifically, "−" indicates a slope related to ΔF and the excitation level being less than 0 on the graph. "+" indicates a monotonic increase tendency (positive direction) of ΔF in accordance with an increase in the excitation level when the graph is prepared, and indicates the slope related to ΔF and the excitation level being greater than 0. "±" indicates that a portion in which the resonance frequency change width ΔF decreases (lowers) and a portion in which the resonance frequency change width ΔF increases (rises) in accordance with the increase in the excitation level are mixed.

More specifically, in the present disclosure, the DLD characteristic can be obtained through measurement of the resonance frequency change width of the crystal vibration element 12 while varying the excitation level (referred to as the excitation power) from 0.01 to 250 μW by using a network analyzer. The "+" portion and the "−" portion being mixed in the DLD characteristic is preferable from a perspective of frequency stabilization at the time of startup.

Preferably, in the DLD characteristic, ΔF changes in accordance with a cubic or higher-degree function in relation to the excitation level and takes at least a local minimum value. More preferably, in the DLD characteristic, ΔF monotonically decreases from 0 to the local minimum value. Further preferably, a slope (Hz/μW) of a straight line connecting a measurement value of ΔF at 0.01 μW and the local minimum value of ΔF on the graph is-20.0 or more. More preferably, this slope is-10.0 or more, and especially preferably, this slope is-7.5 or more. On the other hand, preferably, in the "+" portion, a slope (Hz/μW) of a straight line connecting the local minimum value and a measurement value of ΔF at 250 μW on the graph is $1.0\times10^{-1}$ or less. More preferably, this slope is $5.0\times10^{-2}$ or less, further preferably, this slope is $1.0\times10^{-2}$ or less, and especially preferably, this slope is $5.0\times10^{-3}$ or less.

Crystal impedance (CI) is a value corresponding to series equivalent resistance. When the CI is less than 30Ω, practical loss is determined to be a tolerable level. The CI is preferably 25Ω or less, and is especially preferably 20Ω or less. A lower limit of the CI is not particularly limited as long as it is more than 0.

More specifically, in the present disclosure, the CI is measured by using a network analyzer.

As is apparent from FIG. 3, when the thickness $T_2$ of the excitation electrode 122 is 224.9 nm or more, the DLD characteristic includes the positive direction (+) and the opposite direction (−) being mixed (Examples 1 to 4, and Comparative Examples 3 and 4). With such a tendency, the resonance frequency F which changes once in one direction in accordance with an increase in the excitation level changes in the opposite direction halfway through, the changes thus offsetting one another. Accordingly, change in the resonance frequency F can be suppressed at wider excitation levels.

In a case in which the film thickness of the excitation electrode 122 (thickness $T_2$) is less than 200 nm (Comparative Example 1), and in a case in which the film thickness of the excitation electrode 122 is more than 300 nm, the influence of secondary vibration increases, and thus an electrical characteristic of the crystal vibration element 12 decreases. Particularly, in a case in which the long side of the crystal piece 121 is 1.2 mm or less, the primary vibration is likely to be easily coupled with the secondary vibration, and the resonance frequency F changes rapidly. Therefore, an appropriate electrical characteristic is not achievable outside the range where the thickness $T_2$ of the excitation electrode 122 is 200 nm or more and 300 nm or less.

FIG. 4 is a schematic diagram for describing a characteristic of an amount of change in a frequency in accordance with the excitation level (DLD characteristic). In a case in which ΔF, which is the amount of change in the frequency, has a relationship of a linear function or a quadratic function in relation to the excitation level, as indicated by a broken line, ΔF only increases monotonically as the excitation level increases. That is, precision of the resonance frequency F simply decreases as the excitation level increases. On the other hand, in a case in which ΔF has a relationship of a cubic or higher-degree function in relation to the excitation level and takes each of a local maximum and a local minimum, as indicated by a solid line, ΔF does not increase (or decrease) monotonically within a range between the local maximum and the local minimum or in a small range outside of the range between the local maximum and the local minimum (unless deviating largely from the range between the local maximum and the local minimum). Thus, a range in which the ΔF precision does not largely drop may be maintained.

Here, in a range in which the thickness $T_2$ is 233.5 nm or more and 239.1 nm or less (Examples 2 and 3), ΔF becomes 1.0 ppm or less and falls within a range far smaller than usual (A). That is, the resonance frequency F does not change largely even when the excitation level increases, and a practical issue is less likely to occur.

However, when the thickness $T_2$ of the excitation electrode 122 further increases, the mass M of the excitation electrode 122 increases and has an excessively large effect as a weight, which disrupts vibration of the crystal piece 121. As a result, an increase in the CI is more apparent than ΔF. Here, when the thickness $T_2$ is 256.3 nm or less (Comparative Example 3), a CI less than 30Ω is achievable (B). When the thickness $T_2$ further increases (Comparative Example 4), the CI becomes 30Ω or more, becoming inappropriate for transmission and reception of a resonance frequency signal (C).

That is, as described above, a tendency for the excitation electrode 122 to resonate when the excitation electrode 122 made of gold was thick became apparent. In accordance with a combination (product) of the spring coefficient related to the resonance of the excitation electrode 122 and the spring coefficient related to the resonance of the crystal piece 121, the tendency also includes a change in the resonance frequency F in accordance with the excitation level being suppressed within a wider variation range of the excitation level than in the related art (as a softening spring, the gold excitation electrode 122 offsets the DLD characteristic related to the vibration of the crystal piece 121).

As described above, in the crystal vibration element 12 having a resonance frequency in a high frequency band (here, 76.8 MHz), adjusting the thickness $T_2$ of the excitation electrode 122 to be larger can improve the DLD characteristic of the crystal piece 121. As described above, a variable other than the parameters related to a physical property of the gold excitation electrode 122 and the crystal piece 121 is the product of the thickness $T_2$ and the resonance frequency F. Therefore, by this value falling within a suitable range, an increase in the CI and the like can be suppressed as described above while the crystal vibration element 12 has an improved DLD characteristic.

As described above, when the resonance frequency F is 76.8 MHz, in a range in which the thickness $T_2$ is less than 200 nm (that is, the product value is less than 0.01536), and in a range in which the thickness $T_2$ is more than 300 nm (that is, the product value is more than 0.02304), the influence of the secondary vibration is not suppressible, and thus an appropriate electrical characteristic is not achievable. A practically tolerable range of the thickness $T_2$ is 224.9 nm or more and 256.3 nm or less; that is, a range of the product (mm MHz) in this case is 0.017272 or more and 0.019684 or less. More preferably, the range of the thickness $T_2$ is 233.5 nm or more and 239.1 nm or less; that is, the range of the product (mm MHz) in this case is 0.017933 or more and 0.018363 or less.

Note that, even when the frequency changes, a relationship the same as above can be maintained by the thickness $T_2$ changing accordingly. Considering the influence on the increase in the CI, the above relationship is applicable when the resonance frequency F is in a range of a few tens to a few hundred MHz, particularly a range of 40 to 400 MHz. Also, the resonance frequency F of 76.8 MHz may actually have a slight deviation (for example, from 1 to 2%).

Figure 5A:
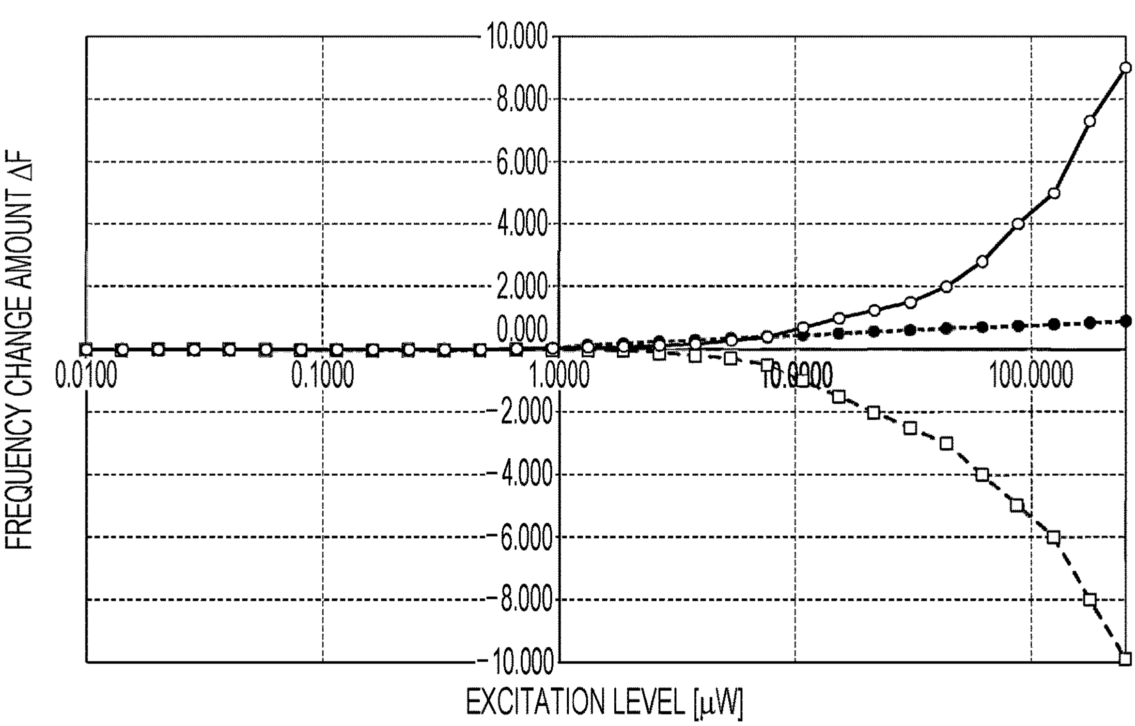
FIG. 5A is a graph illustrating a measurement example of the DLD characteristic in accordance with the thickness of the excitation electrode.
Figure 5B:
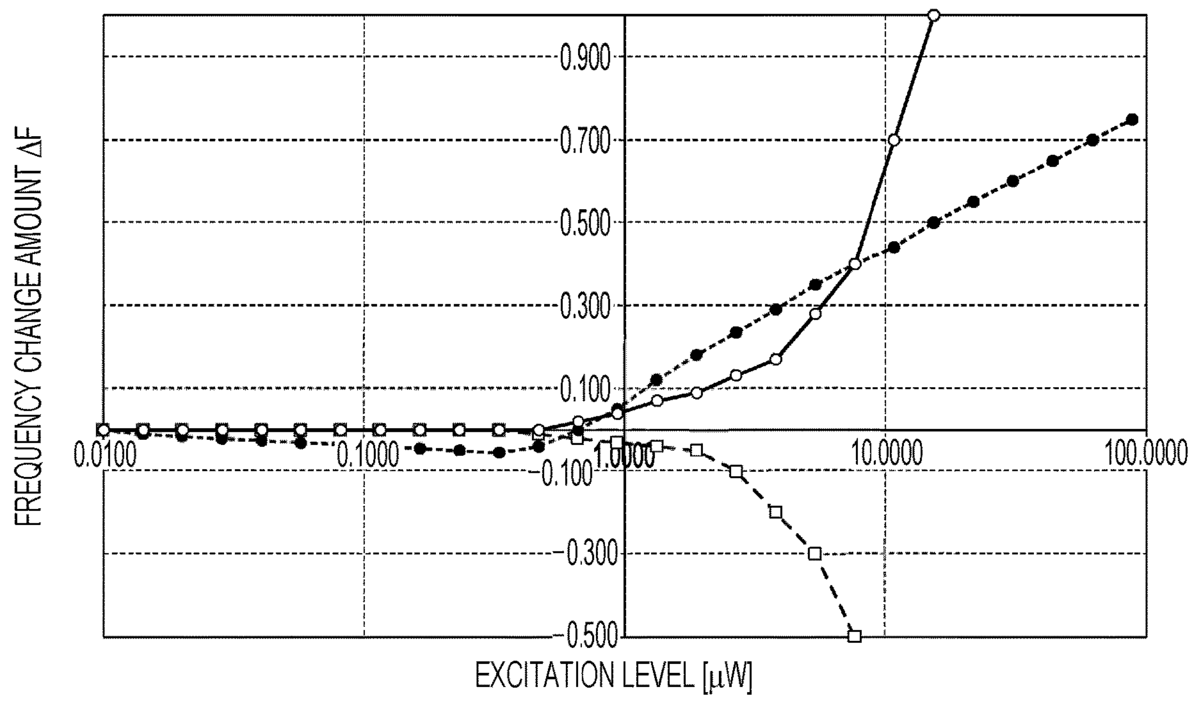
FIG. 5B is a partially enlarged diagram of FIG. 5A.

FIG. 5A is a graph illustrating measurement results of ΔF (Y-axis: normal scale) in relation to the excitation level (X-axis: logarithmic scale) in cases in which the thickness $T_2$ is 102.0 nm (Comparative Example 1, white circles and a solid line), 220.6 nm (Comparative Example 2, white squares and a broken line), and 233.5 nm (Example 2, black circles and a broken line). FIG. 5B is an enlarged diagram of the specific region in FIG. 5A.

In the case in which the thickness $T_2$ is 102.0 nm, ΔF exhibits a monotonic increase in the measurement range. In the case in which the thickness $T_2$ is 220.6 nm, ΔF exhibits a monotonic decrease in the measurement range. On the other hand, in the case in which the thickness $T_2$ is 233.5 nm, in the "−" portion, a slope (Hz/μW) of a straight line connecting a measurement value at 0.01 μW and a measurement value at the local minimum on the graph is-5.05, whereas in the "+" portion, a slope of a straight line connecting the measurement value at the local minimum and a measurement value at 250 μW on the graph is $-3.82\times10^{-3}$. It can be seen that, by the crystal vibration element 12 taking the respective values described above in the "−" portion and the "+" portion, an increase in the CI and the like can be suppressed while the crystal vibration element 12 has an improved DLD characteristic.

As described above, in this embodiment, the crystal vibration element 12 (crystal element) includes the crystal piece 121 and the excitation electrode 122. The excitation electrode 122 includes the base layer and the conductive layer. The base layer is positioned on both surfaces of the crystal piece 121 at the identical position in plan view on the respective surfaces. The conductive layer is positioned on the base layer (that is, sandwiching the base layer between the conductive layer and the crystal piece 121) and has a gold content of 90% or more in mass ratio. The product value of the thickness (mm) of the excitation electrode 122 and the resonance frequency (MHz) of the crystal vibration element 12 is 0.017272 or more and 0.019684 or less.

In the crystal vibration element 12, by defining the thickness $T_2$ of the excitation electrode 122 as described above in relation to the resonance frequency, the crystal vibration element 12 has an improved DLD characteristic, and can maintain an appropriate resonance frequency F regardless of an increase in the excitation level.

Furthermore, more preferably, the product value is 0.017933 or more and 0.018363 or less. When the product value is within this range, the crystal vibration element 12 has a sufficiently improved DLD characteristic compared with the related art, and the CI value can also be kept small. Thus, the crystal vibration element 12 can vibrate efficiently in relation to the electric power.

The resonance frequency F may be 76.8 MHz. At this frequency, the CI as well as the DLD characteristic can be brought to an optimal range.

In this embodiment, the crystal device 1 includes the above-described crystal vibration element 12. According to the crystal device 1, a stable resonance frequency F is obtainable in a wide range regardless of a change in the excitation level. Therefore, the crystal device 1 can be stably utilized in an electronic device or the like at a variety of excitation levels.

In this embodiment, the crystal vibration element 12 includes the crystal piece 121 and a pair of electrodes **122*a* and 122*b*. Each electrode is positioned on the corresponding one of both surfaces of the crystal piece 121 and includes the conductive layer having a gold content of 90% or more in mass ratio. The DLD characteristic of the crystal element 12** includes the portion in the positive direction (+) and the portion in the opposite direction (−) mixed.

Therefore, the crystal vibration element 12 has an improved DLD characteristic, and resonance is easily caused in the vicinity of an appropriate frequency regardless of a change in the excitation level. Accordingly, in the crystal vibration element 12, a frequency at a time of startup stabilizes.

The crystal vibration element 12 includes the base layer between the conductive layer and the crystal piece 121. Therefore, in the crystal vibration element 12, the electrodes **122*a* and 122*b* can be joined with certainty to the crystal piece 121**.

The resonance frequency of the crystal vibration element 12 is 40 MHz or more and 400 MHz or less. When the crystal piece 121 has a thickness corresponding to such a resonance frequency band, and the electrodes **122*a* and 122*b* have, as described above, the thickness $T_2$ within the appropriate range thicker than in the related art, the crystal vibration element 12** can stably have an improved DLD characteristic.

The thickness of the conductive layer of the crystal vibration element 12 is 50 nm or more and 600 nm or less. By adjusting the thickness of the conductive layer of each of the electrodes **122*a* and 122*b* to be within this range, the DLD characteristic includes the "+" portion and the "−" portion, and ΔF can be suppressed. Accordingly, the crystal vibration element 12** has an improved DLD characteristic.

The crystal impedance of the crystal vibration element 12 is less than 30Ω. Decreasing the CI enables the crystal vibration element 12 to vibrate efficiently with low loss.

Note that the embodiment described above is an illustration, and various changes are applicable.

For example, although the embodiment describes the crystal vibration element 12 as a part of the crystal device 1, the crystal vibration element 12 is not limited to such a crystal vibration element 12. The crystal vibration element 12 alone may be distributed (e.g., produced and/or sold).

In the embodiment, the appropriate range of the thickness $T_2$ is considered while only the DLD characteristic and the CI are taken into account. However, not being limited to such a case, another parameter may additionally be taken into account.

The concrete configurations, materials, and structures described in the embodiment are suitably changeable without departing from the scope of the present invention. The scope of the present invention includes the scope of the invention recited in the claims and the equivalent thereof.

INDUSTRIAL APPLICABILITY

The present disclosure is applicable to a crystal element and a crystal device.

The invention claimed is:

1. A crystal element comprising:
a crystal piece; and
a pair of electrodes, each of the electrodes being positioned on a corresponding one of both surfaces of the crystal piece and comprising a conductive layer having a gold content of 90% or more in mass ratio, wherein
the crystal element has a drive level dependency (DLD) characteristic in which a portion in a positive direction (+) and a portion in an opposite direction (−) are mixed; and wherein a crystal impedance of the crystal element is less than 30 Ω.

2. The crystal element according to claim 1, further comprising a base layer between the conductive layer and the crystal piece.

3. The crystal element according to claim 1, wherein a resonance frequency of the crystal element is 40 MHz or more and 400 MHz or less.

4. The crystal element according to claim 1, wherein a thickness of the conductive layer is 50 nm or more and 600 nm or less.

5. The crystal element according to claim 1, wherein the pair of electrodes is positioned at an identical position in plan view.

6. A crystal device comprising the crystal element according to claim 1.

7. A crystal element comprising:
a crystal piece; and
a pair of electrodes, each of the electrodes being positioned on a corresponding one of both surfaces of the crystal piece and comprising a conductive layer having a gold content of 90% or more in mass ratio, wherein
the crystal element has a drive level dependency (DLD) characteristic in which a portion in a positive direction (+) and a portion in an opposite direction (−) are mixed and wherein a product value of a thickness (mm) of the conductive layer and a resonance frequency (MHz) of the crystal element is 0.017272 or more and 0.019684 or less.

8. The crystal element according to claim 7, further comprising a base layer between the conductive layer and the crystal piece.

9. The crystal element according to claim 7, wherein a resonance frequency of the crystal element is 40 MHz or more and 400 MHz or less.

10. The crystal element according to claim 7, wherein a thickness of the conductive layer is 50 nm or more and 600 nm or less.

11. The crystal element according to claim 7, wherein the pair of electrodes is positioned at an identical position in plan view.

12. A crystal device comprising the crystal element according to claim 7.

13. A crystal element comprising:

a crystal piece; and an electrode comprising:

a base layer positioned on both surfaces of the crystal piece at an identical position in plan view on the respective surfaces; and a conductive layer positioned on the base layer and having a gold content of 90% or more in mass ratio, wherein a product value of a thickness (mm) of the conductive layer and a resonance frequency (MHz) of the crystal element is 0.017272 or more and 0.019684 or less.

14. The crystal element according to claim 13, wherein the product value is 0.017933 or more and 0.018363 or less.

15. The crystal element according to claim 13, wherein the resonance frequency is 76.8 MHz.

16. A crystal device comprising the crystal element according to claim 13.

* * * * *